(12) United States Patent
Kwasnick et al.

(10) Patent No.: US 6,724,010 B1
(45) Date of Patent: Apr. 20, 2004

(54) SOLID STATE IMAGER HAVING GATED PHOTODIODES AND METHOD FOR MAKING SAME

(75) Inventors: Robert Forrest Kwasnick, Palo Alto, CA (US); George Edward Possin, Niskayuna, NY (US); Ching-Yeu Wei, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 583 days.

(21) Appl. No.: 09/632,106

(22) Filed: Aug. 3, 2000

(51) Int. Cl.[7] ............... H01L 31/0392; H01L 31/0376
(52) U.S. Cl. ............... 257/59; 257/53; 257/60; 257/458
(58) Field of Search ............... 257/53, 59, 60, 257/458

(56) References Cited

U.S. PATENT DOCUMENTS

| | | |
|---|---|---|
| 4,729,005 A | 3/1988 | Wei et al. |
| 5,399,884 A | 3/1995 | Wei et al. |
| 5,435,608 A | 7/1995 | Wei et al. |
| 5,480,810 A | 1/1996 | Wei et al. |
| 5,516,712 A | 5/1996 | Wei et al. |
| 5,663,577 A | 9/1997 | Kwasnick et al. |
| 6,300,648 B1 * | 10/2001 | Mei et al. .............. 257/59 |
| 6,384,461 B1 * | 5/2002 | Lu et al. ............... 257/458 |

* cited by examiner

*Primary Examiner*—Gene M. Munson
(74) *Attorney, Agent, or Firm*—Donald S. Ingraham; Christian G. Cabou (57) ABSTRACT

A solid state imager is provided that comprises an imaging array of gated photodiodes. The imager comprises a plurality of photosensor pixels arranged in a pixel array, and each of the photosensor pixels includes a photodiode having a sidewall, the sidewall having a gate dielectric layer disposed thereon, and a field plate disposed around the photodiode body. The field plate comprises amorphous silicon disposed on the gate dielectric layer and extends substantially completely around the sidewall of said photodiode. The field plate is electrically coupled to the common electrode of the imaging array so that the field plate creates an electric field around the photodiode body in correspondence with the potential of said common electrode. A method of fabricating the gated photodiode array is also provided.

20 Claims, 8 Drawing Sheets

SOLID STATE IMAGER HAVING GATED PHOTODIODES AND METHOD FOR MAKING SAME

The U.S. Government may have certain rights in this invention pursuant to contract number 70NANB5H1099 awarded by the National Institute of Standards and Technology.

BACKGROUND OF THE INVENTION

The invention relates generally to large area solid state imager devices and specifically to imager devices having reduced photodiode sidewall leakage.

Solid state imager devices are used for radiation imaging (e.g., x-rays), such as for use in medical diagnostics. Such solid state imager devices commonly comprise arrays of photosensor elements with associated switching elements arranged in rows and columns, with the photosensor elements being addressed by rows of scan lines (also referred to as address lines) and columns of data lines (also referred to as read-out lines). Typically, the photosensor elements are photodiodes, and the switching elements are thin film field effect transistors (FETs or TFTs).

One of several factors that can influence solid state imager performance is the amount or level of photodiode reverse bias leakage. In the solid state imager devices to which the present invention is directed, the photodiode leakage is regarded as having two components, sidewall leakage (from surfaces of the photodiode with substantial incline to the substrate) and area leakage (from photodiode surfaces substantially parallel to the substrate).

In imager devices to be used in medical applications, the photodiodes in a representative pixel typically have approximately square dimensions on the order of about 0.1 to 0.4 mm in length and width. At such sizes, the sidewall leakage component is of the same order of magnitude as the area leakage component; thus both components contribute significantly to the leakage, thereby degrading the performance of the imager. For example, in radiographic applications, the exposure time (between read outs of the array) can be as long as two (2) seconds, and a photodiode leakage of even 1 pA will degrade performance significantly by saturation of the charge that the photodiode is able to collect, and by contributing to imager noise and offset drift associated with the leakage current.

The potential severity of the photodiode leakage problem is best appreciated when it is considered that the photodiodes may operate under about 10V common bias, at a temperature somewhat above room temperature due to heat generated by surrounding electronic components. Further, the imager device may have on the order of one million ($1 \times 10^6$) photodiodes, of which a high percentage must not be leaky in order to avoid having an excessive number of bad pixels. It is therefore desirable to reduce the reverse bias leakage of the imager photodiodes to the extent practicable, while avoiding an increase in the cost and/or complexity of the imager fabrication process, and while avoiding any degradation in performance or reliability.

SUMMARY OF THE INVENTION

A solid state imager is provided that comprises an array of gated photodiodes. The imager comprises a plurality of photosensor pixels arranged in a pixel array, and each of the photosensor pixels includes a photodiode having a side wall, the sidewall having a gate dielectric layer disposed thereon, and a field plate disposed around the photodiode body. The filed plate comprises amorphous silicon disposed on the gate dielectric layer and extends substantially completely around the sidewall of said photodiode. A method of fabricating the gated photodiode array is also provided.

BRIEF DESCRIPTION OF THE DRAWINGS

These and other features, aspects and advantages of the present invention will become better understood when the following detailed description is read with reference to the accompanying drawings, in which like reference numerals refer to like components, and wherein.

DETAILED DESCRIPTION

A radiation imager 100 (FIG. 11) fabricated in accordance with the present invention comprises a plurality of gated photodiodes. The term "imager", as used herein, refers to a solid state device that is adapted to absorb incident radiation of a particular wavelength (such as optical photons, x-rays, or the like) and to generate an electrical signal corresponding to the absorbed radiation. As is known in the art, typically the pixels are disposed in an array having a pattern of rows and columns. As each pixel 110 is individually addressable by respective rows of scan lines and columns of data lines, the spatial distribution of radiation absorbed by the array is also determinable. The photosensor array is electrically coupled to electrical circuits (not shown) situated off of the substrate. Those circuits amplify and process the electrical signals generated by the array.

As an example, an array of such pixels may be a light imaging array (e.g., an array of photosensors such as photodiodes), and can be employed as an x-ray imager by coupling the light imager array to an x-ray scintillator (which comprises a material that emits optical photons when the x-ray radiation (or other type of radiation being detected) is absorbed in the scintillator).

"Gated photodiodes" as used herein refers to diode assemblies in which have a band (or belt) of semiconductive material disposed around the sidewalls of the photodiode body so as to provide a "field plate", or means, when in operation, of establishing an electrical field around the diode body so as to reduce electrical leakage from the sidewalls of the diode in the array. The belt of semiconductive material disposed around the diode body sidewalls (with dielectric material disposed between the diode body and the belt of semiconductive material) is typically electrically coupled to the anode of the diode. This arrangement forms a "field plate" or "gated" diode structure that reduces diode leakage.

A number of processes exist by which photosensor arrays can be fabricated; it is desirable that fabrication processes provide not only components in the array that deliver desired performance but also that the fabrication steps be efficient from a time and resource standpoint. By way of example and not limitation, the imager devices described herein are produced by what is referred to as a reduced mask set imager process, one aspect of which is that the photodiode bodies (comprising the semiconductive material of the diode) for the respective pixels are deposited prior to the deposition of the associated thin film transistors. The solid state imager of the present invention, which has decreased reverse bias current leakage, is fabricated in steps, with the resultant structures from identified steps being illustrated in FIGS. 1A–D, and in corresponding cross-section views 2A≧D and 3A–D. The reduced mask fabrication method is discussed generally in U.S. Pat. Nos. 5,399,844; 5,435,608; and 5,480,810; all of which are assigned to the assignee herein. The present invention provides modifications to the process to achieve the pixel configuration resulting in the reduction in reverse bias leakage of the photodiodes.

For purposes of illustration and not limitation, a representative pixel 110 is illustrated in the figures herein and the accompanying description refers to such a representative pixel. Pixels 110 are typically disposed on a substrate 105 (FIGS. 1A–1D). Each pixel 110 comprises a photosensor, such as photodiode 126, as shown and described herein, and a switching device such as a thin film field effect transistor (FET), also referred to as a TFT. Typically, in accordance with known fabrication processes, fabrication of all pixels on a substrate 105 that will form a particular imager photosensor array proceeds simultaneously.

Figure 1A:
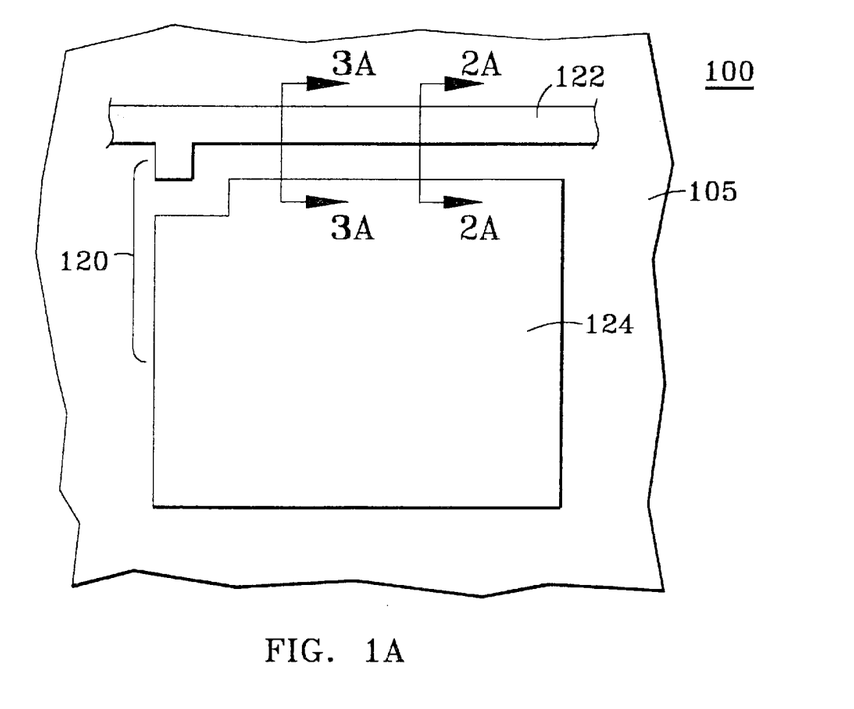
FIGS. 1A–D are substantially schematic top plan views of a representative photosensor pixel of the present invention at the various steps of a production process.
Figure 2A:
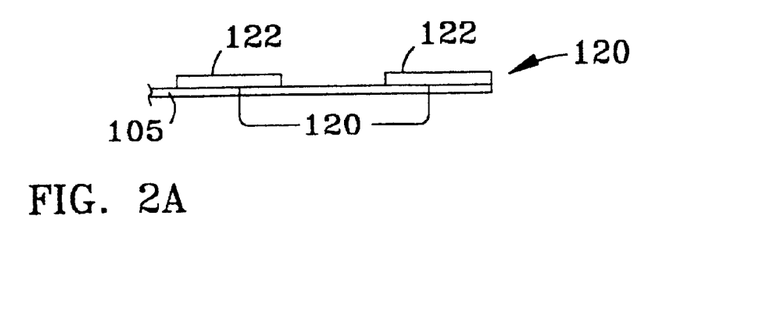
FIGS. 2A–D are substantially schematic cross-sectional views taken along the noted section lines in FIGS. 1A–D, respectively.
Figure 3A:
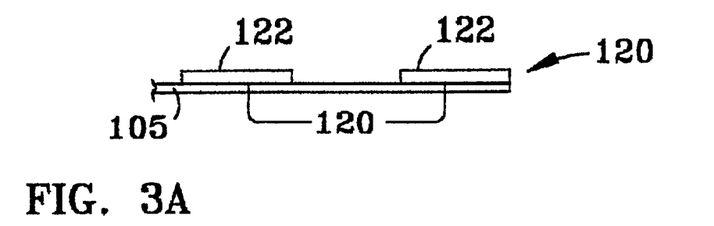
FIGS. 3A–D are substantially schematic cross-sectional views taken along the noted lines in FIGS. 1A–D, respectively.

In accordance with the method of the invention, a first conductive layer 120 is deposited on a surface of substrate 105 (a portion of first conductive layer 120 remaining after etching is illustrated in FIGS. 1A, 2A, 3A). A gate electrode 122 and photosensor bottom gate electrode 124 are formed in a common etching sequence by etching first conductive layer 120 in accordance with a pattern, such as is defined by an appropriately patterned photoresist mask, conforming to the desired positioning of the gate electrode 122 and the bottom electrode 124. As used herein, the term "common etching sequence" and similar terms refer to the coincident formation of components in the pixel, such as etching the underlying material to be formed into respective components, in one set of etching steps through one patterned photoresist mask.

The conductive layer 120 from which gate electrode 122 and photosensor bottom electrode 124 is formed typically comprises indium-tin-oxide (ITO), or a metal such as chromium, titanium, molybdenum, aluminum, or the like, deposited in one or in multiple layers to a thickness on the order of 100 Angstroms to 10,000 Angstroms.

Figure 1B:
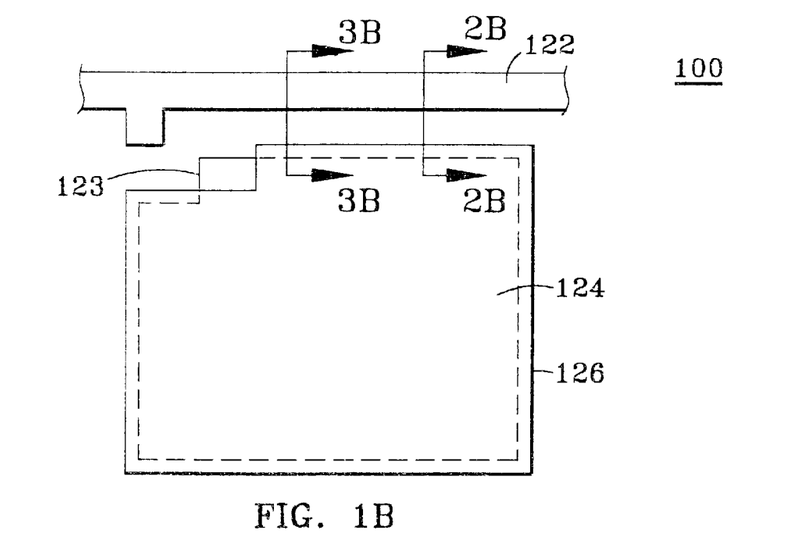
Figure 2B:
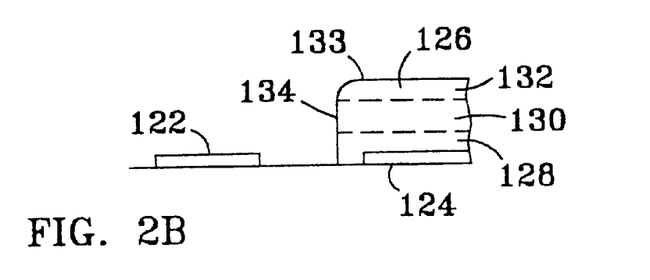
Figure 3B:
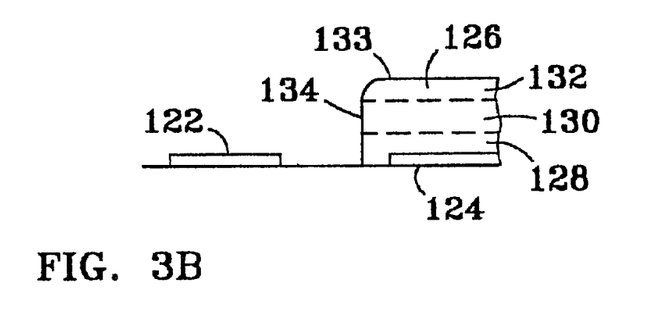
Figure 3C:
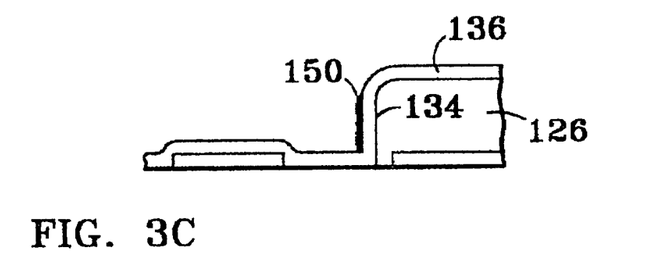
Figure 3D:
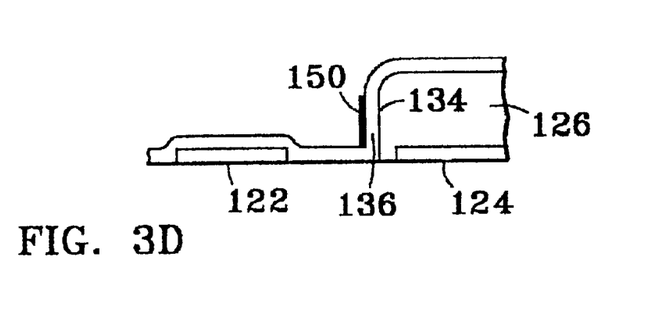

After gate formation, the photodiode island 126 is formed (FIGS. 1B, 2B, 3B; the portion of diode bottom electrode underlying the diode island 126 is illustrated in phantom). The photodiode island 126 typically comprises three layers (illustrated with broken lines in cross-sectional FIGS. 2B and 3B) of amorphous silicon (a-Si), with an n-type doped amorphous silicon layer 128 deposited first, followed by an undoped amorphous silicon layer 130, also referred to as intrinsic amorphous silicon (i-Si) and then a p-type doped amorphous silicon layer 132. The representation in FIGS. 2B and 3B are for purposed of illustration only; typically the n-type and p-type layers are thinner than the undoped amorphous layer. In addition, the photodiode island may have a thin layer of conductive transparent material such as indium tin oxide (ITO) disposed across the upper surface 133 of the photodiode. The layer of ITO is not shown in the Figures, in order to simplify the illustration of the device. The preferred thickness of the photodiode island 126 is in the range of about 0.5 $\mu$m to about 2.5 $\mu$m.

As with conductive layer 120, the layers making up photodiode island 126 are initially deposited substantially uniformly across the substrate 105, and the gate electrodes 122 and bottom electrodes 124 situated thereon. The photodiode islands are then formed by etching through silicon layers 132, 130, 128, to expose the gate electrode 122, with the island being formed (see FIG. 1B) over all but a small contact portion 123 of bottom electrode 124.

In the present invention, the etching of the photodiode island material is done so as to render the photodiode sidewalls 134 substantially vertical (e.g., desirably disposed at an angle with respect to substrate surface 105 of about 85 to about 90 degrees), as is practicable within economic and technological constraints. It is especially desired that the sidewall 134 be formed having at least a portion thereof oriented substantially vertically. This may be achieved by a reactive ion etching (RIE), for example with $SF_6$ or HCl 20 sccm/30 sccm, at 1.6 W/cm$^2$ and 13.56 MHz, and at a pressure of about 100 mTorr to about 80 mTorr.

Figure 9:
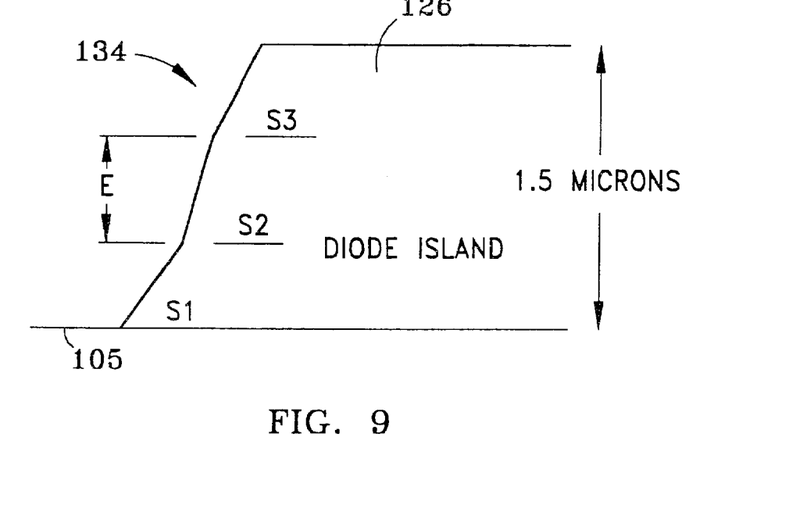
FIG. 9 is a substantially schematic cross-sectional view of a representative photodiode island in accordance with the present invention.

As a practical matter, it is extremely difficult with current etching technologies, to obtain a completely vertical sidewall 134 on the photodiode island 126. FIG. 9 and associated Table I below provide examples of contour and orientation of portions of the sidewalls 134 that are reasonably attainable with a 1.5 micron thick diode island using the reactive ion etching of the present invention. The verticality of sidewall 134 resulting from this process is determined partly by the slope of the patterning photoresist; the post-bake of the resist required after resist pattern delineation is done so that the resist is not excessively cross-linked during RIE (which may make the resist to difficult to remove subsequent to RIE) and tends to make the resist profile less vertical.

TABLE I (1.5 micron thickness diode island)

| RIE Pressure (mT) | bottom slope S1 (approx. deg) | middle slope S2 (approx. deg) | extent of middle region E (approx. microns) | top slope S3 (approx. deg) |
|---|---|---|---|---|
| 100 | 75° | 90° | 0.37 to 0.67 | 77° |
| 80 | 80° | 85° to 90° | 0.37 | 77° |
| 60 | 76° | no middle region | no middle region | 67° |
| 50 | 75° | no middle region | no middle region | 64° |

It can be seen from Table I that the use of pressures lower then about 80 mTorr yield a sidewall having no substantially vertical portion, but only a sloping sidewall which decreases in steepness from the lower (S1) to the upper (S3) end. In contrast, the use of a pressure of 80–100 mTorr produces an intermediate section S2 of the sidewall which is substantially vertical, that is, oriented on the order of 85°–90° to the substrate surface (referring to the direction of perpendicular or orthogonal to the surface of the substrate. It can further be seen that, at the higher 100 mTorr pressure, the intermediate section S2 is more vertical/orthogonal and extends over a greater portion of the height of the sidewall, than does the intermediate section S2 formed using 80 mTorr as the RIE pressure.

Figure 1C:
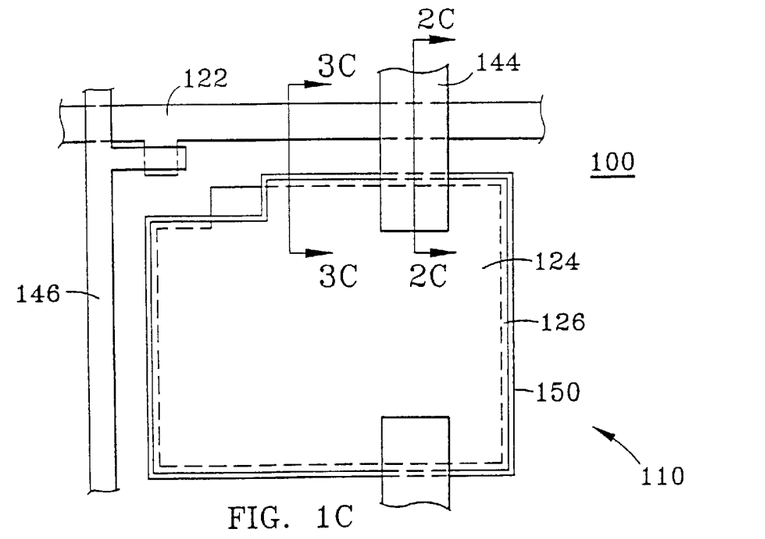
Figure 1D:
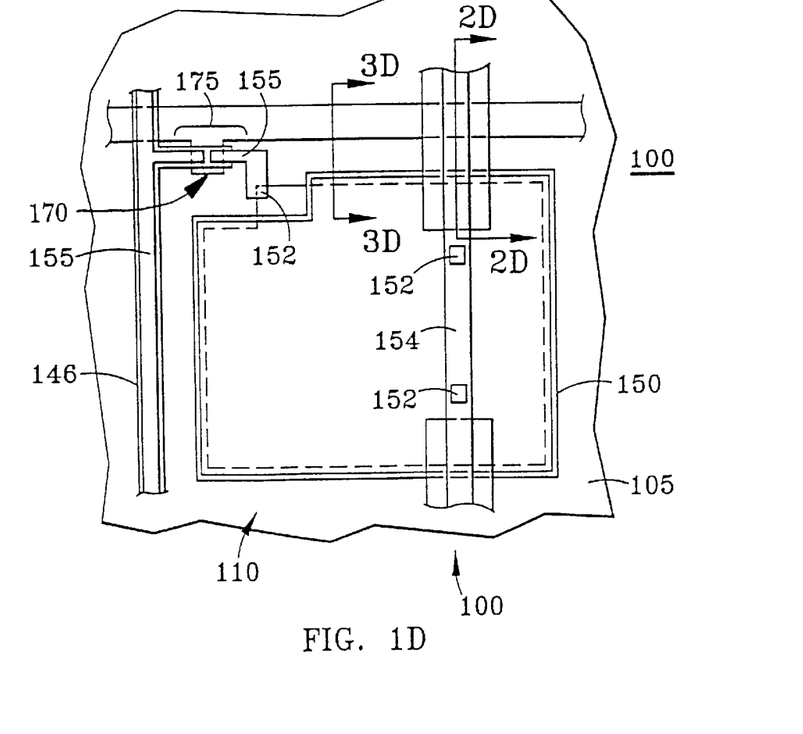

Following the formation of the photodiode 126, the thin film transistor (TFT) deposition and patterning is performed, as illustrated in FIGS. 1C and D; 2C and D; 3C and D. Commonly, in a plasma-enhanced chemical vapor deposition (PECVD) process, multiple layers of material are deposited that are then patterned to provide the desired component structure on the array. For example, a gate dielectric layer 136 is deposited first, which layer typically comprises one or more layers of silicon nitride, silicon oxide, or combinations thereof, and is deposited at a thickness in the range of about 0.1–0.5 microns.

Figure 2C:
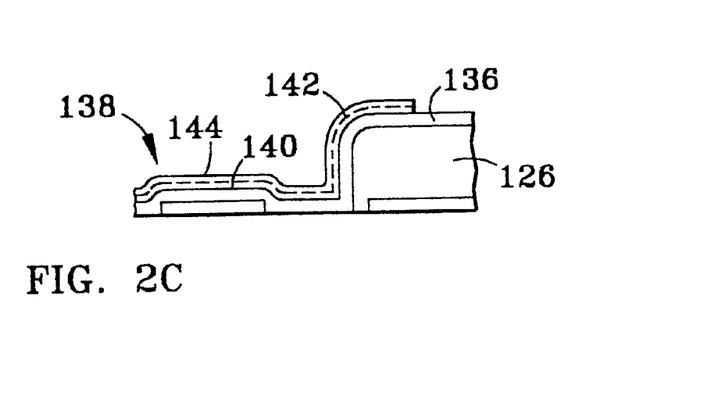

Additionally, materials 138 to form thin film transistor (TFT) 175 (FIG. 1D) are deposited in the PECVD process. The TFT 138 commonly comprises an inverted-staggered TFT, having two PECVD silicon layers (see FIG. 2C), a first layer 140 of which is intrinsic amorphous silicon (i-Si) in a thickness of about 0.1 μm to 0.3 μm. The second or top layer 142 of TFT 138 commonly comprises n+-doped Si (n+-Si) of a thickness less than about 0.1 μm. In FIG. 2C, layer 138 is shown after the patterning step described below. As is known in the art, a thin metal capping layer (not shown) of, for example, Mo or Cr, may optionally be formed on the top of second layer 142 of TFT 138.

As is the case in the known standard reduced mask set process, the next step is to form TFT/FET islands 144, 146 (see FIG. 1C) at desired locations, by removing the deposited TFT-silicon material from other areas on the pixel 110. As used herein, "TFT material silicon material" and the like refer to the semiconductive portion of the TFT, illustrated in the Figures generally as item 138. This selective TFT silicon material removal is typically achieved using an etching procedure. In the process of the present invention, this etching step is conducted so as to remove the TFT material from the horizontal (that is, parallel to substrate) planar surfaces of the pixel, but to avoid removing, or to remove only a portion of, the TFT silicon material disposed on the substantially vertical sidewall portions 134, of the photodiode 126, so as to form a spacer (or belt) 150 forming a belt-like layer of silicon around the photodiode body sidewalls.

In order to accomplish this, a reactive ion etch, or dry etch is employed, using, for example, a SF$_6$/HCl 20 sccm/30 sccm etchant, at 1.1 W/cm$^2$ and 13.56 MHz, with a pressure of about 100 mTorr. The etching is performed to an emission endpoint, for example, based on a Si line at 288 nm, plus a few minutes (typically determined empirically), generally about one to three minutes. If the etching time is too short, residual silicon material remains along the gate steps or on the field (other horizontal surfaces) of the array, leading to inter-pixel leakage. If the etching time is too long, the underlying gate dielectric material can be etched away, which can also cause leakage in the array, and prolonged etching can also result in etching away of the silicon material that forms field plate (or belt spacer) 150.

This etching procedure results in the TFT silicon material being removed from the desired horizontal surfaces while leaving intact the field plate (or belt spacer) 150 of the TFT silicon material (i.e., an a-Si material) around the perimeter of the photodiode 126, on the substantially vertical sidewalls 134 of the photodiode body. The etching process will typically etch off the upper n+-doped Si material from the vertical photodiode sidewalls 134, and thus the layer of silicon forming field plate 150 typically comprises only the i-Si portion of the initially deposited TFT material, which material extends in a continuous belt around the sidewalls of photodiode body 126. The gate electrode dielectric layer 136 is disposed between field plate 150 and the sidewall of the photodiode 126, thus leaving the silicon of field plate (or spacer) 150 electrically isolated from diode body so that the gated diode structure of the present invention can be formed.

The formation of field plate (or belt spacer) 150 on the sidewall of photodiode 126 is made possible by the order of steps employed in a reduced mask set process, in particular, because the photodiode is formed prior to forming the TFT islands in the reduced mask set process.

Subsequent to the formation of the TFT/FET islands 144, 146 and field plate (or belt spacer) 150, the device fabrication process continues by forming vias 152 in the gate dielectric layer, followed by the deposition and patterning of a source/drain metal layer (source/drain metal refers to the common material used to form both the source and drain electrodes in the TFT), which is patterned to form common electrode lines 154 and other contacts 155 (that comprise, for example, the source and drain electrodes of the TFT and the readout line coupled to the TFT. The source/drain metal layer typically is a conductive material such as molybdenum, chromium, or the like.

Figure 2D:
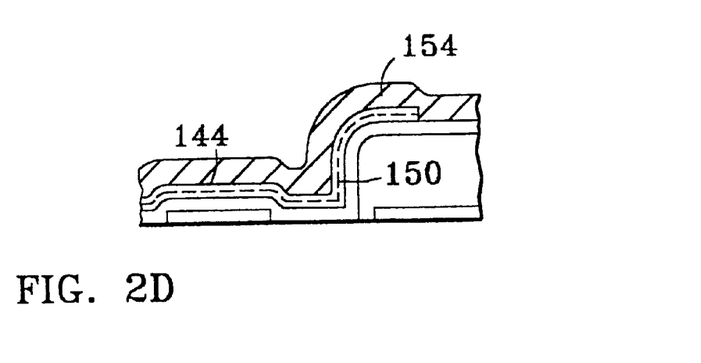

As seen in FIG. 2D, the common electrode lines 154 overlap the sidewalls of the photodiode islands at regions in the vicinity of TFT island structures 144. In operation, the common electrodes are generally held at a fixed potential. Since the common electrode 154 contacts the a-Si material of field plate (or belt spacer) 150, which is slightly conductive, the silicon in belt 150 charges up to the bias of the common electrode. The electric field provided by the field plate 150 results in a reduction, in operation, of reverse bias leakage from the photodiode 126. Furthermore, if the common electrode is negatively biased, as is the case with p/i/n-type photodiodes (top to bottom layers, as seen in FIGS. 2B, 3B), then the potential of the field plate 150 silicon material is negative with respect to the more positive potential of the body of diode 126 and a highly conductive FET channel charge layers forms in the silicon of belt spacer 150. This situation significantly increases the conductivity of the silicon field plate enhancing the field on the diode sidewall.

In final processing, additional material is removed from regions of the TFT/FET islands 144, 146 that are not covered in source/drain metal. This step removes the n+-Si layer and a small amount of the underlying i-Si layer, so that about 50 nm to about 100 nm of the n+-Si and i-Si are removed in total; the purpose of this removal is to create a functioning TFT, as is known in the art. Reactive ion etching is the preferred procedure because the material is etched substantially orthogonally to the surface, and thus will not remove, or will remove only a slight amount of, the spacer material 150 along the sidewall 134 of the photodiode. The reactive ion etch may preferably employ SF$_6$ and HCl, as in prior etching steps. If desired or necessary, an additional photoresist masking layer (not shown) can be used at this step to protect the field plate (or belt spacer) 150 material on the diode sidewalls while allowing the n+ layer 142 to be removed from the FET channel 170. The photoresist masking layer is disposed over the array with respective pixel apertures disposed to allow the etching of the silicon material in the channel regions 170.

Figure 4:
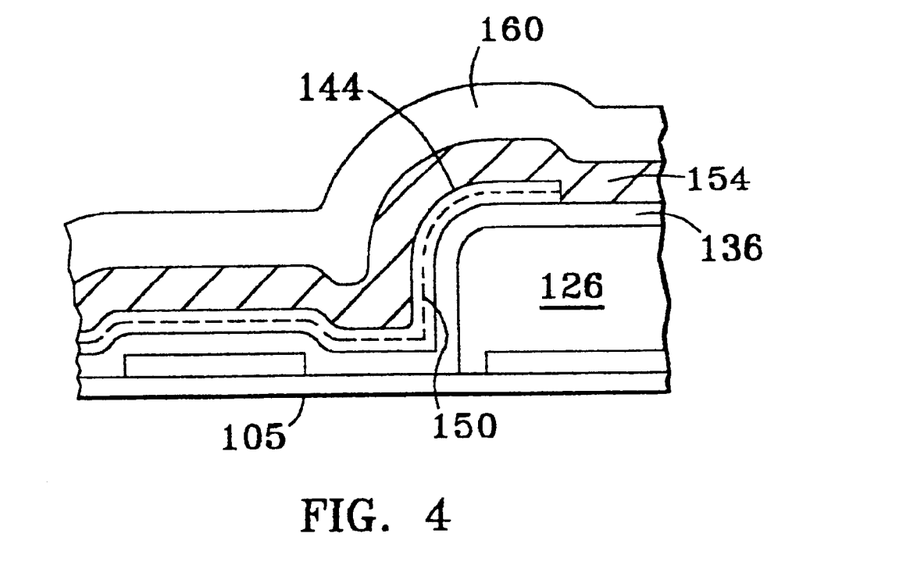
FIGS. 4 and 5 are substantially schematic cross-sectional views of the device illustrated in FIGS. 2D and 3D, respectively, with a final barrier layer deposited over the exposed surfaces of the photosensor pixel of the present invention.
Figure 5:
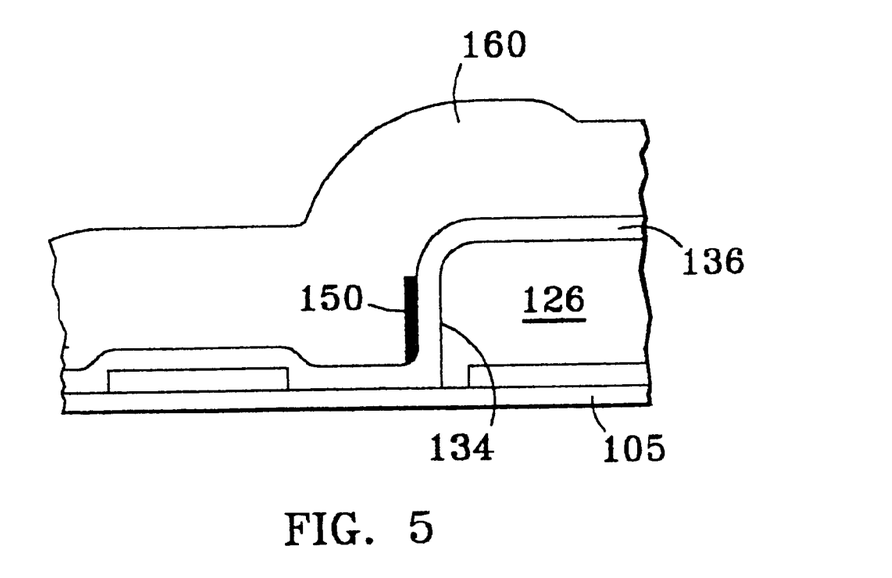
Figure 11:
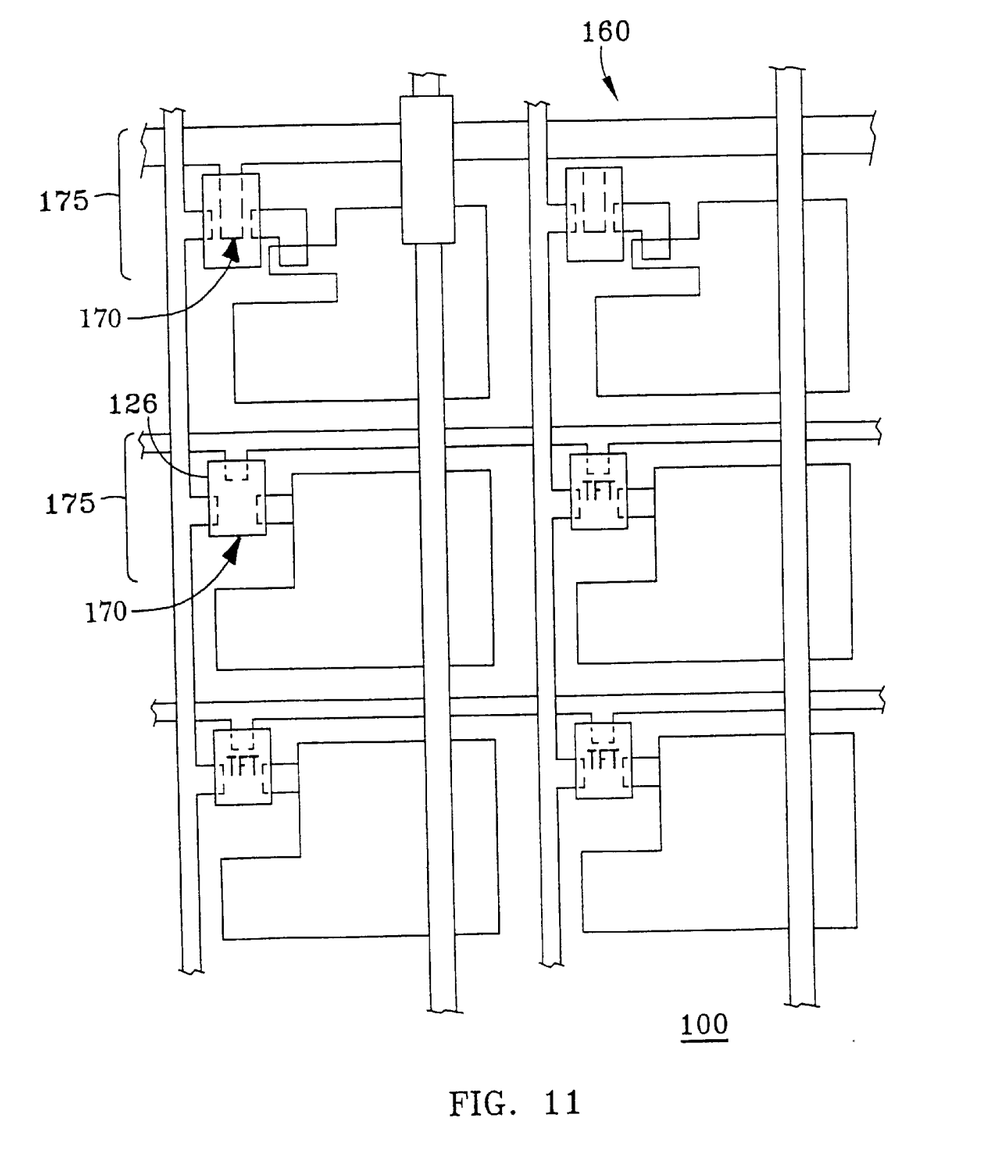
FIG. 11 is a plan view of the imager array showing a plurality of representative pixels and with respective photoresist TFT apertures.

The imager is then completed by the deposition of a barrier layer 160 (FIGS. 4 and 5), which passivates the surface of the TFT/FET islands 144, 146, and seals the exposed surfaces of the entire device. The barrier layer is preferably about 0.5 μm to about 2.0 μm in thickness, and may preferably comprise $SiO_x$, $SiN_x$, or combinations thereof. FIG. 11 shows a plan view of the imager array 100 with respective photoresist TFT apertures 165 over the TFT regions to allow etching of the channel 170.

Figure 6:
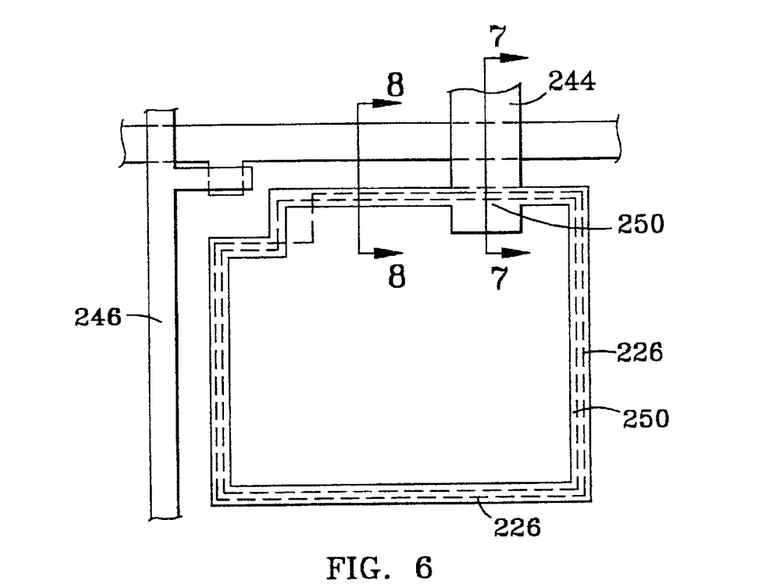
FIG. 6 is a substantially schematic top plan view of a representative photosensor pixel in accordance with a further embodiment of the present invention.
Figure 7:
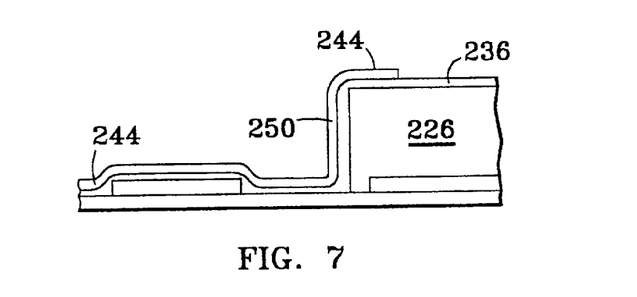
FIG. 7 is a substantially schematic cross-sectional view taken along section line 7—7 in FIG. 6.
Figure 8:
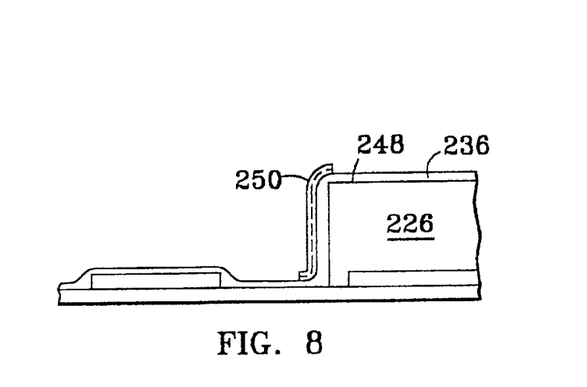
FIG. 8 is a substantially schematic cross-sectional view taken along section line 8—8 in FIG. 6.

FIGS. 6, 7 and 8 illustrate an alternative embodiment of the present invention, produced by using standard photolithography in the step in which the TFT/FET islands 244, 246, are initially formed. When using photolithography, TFT island 244 typically is patterned such that the island remains around the perimeter of the photodiode 226, overlapping (see FIG. 7) the upper planar surface 248 of the photodiode, which has the layer of gate dielectric material 236 deposited thereon. This overlap of material decreases the photoresponse or sensitivity of the photodiode 226 to a certain degree, however, it also results in a wider or thicker layer of the a-Si material to act as the sidewall field plate (or belt spacer) 250 to provide the gated diode structure. As compared with the use of RIE to etch the TFT/FET islands in the previous embodiment, the use of photolithography provides a more reliable method for leaving the Si material on the sidewall.

Figure 10:
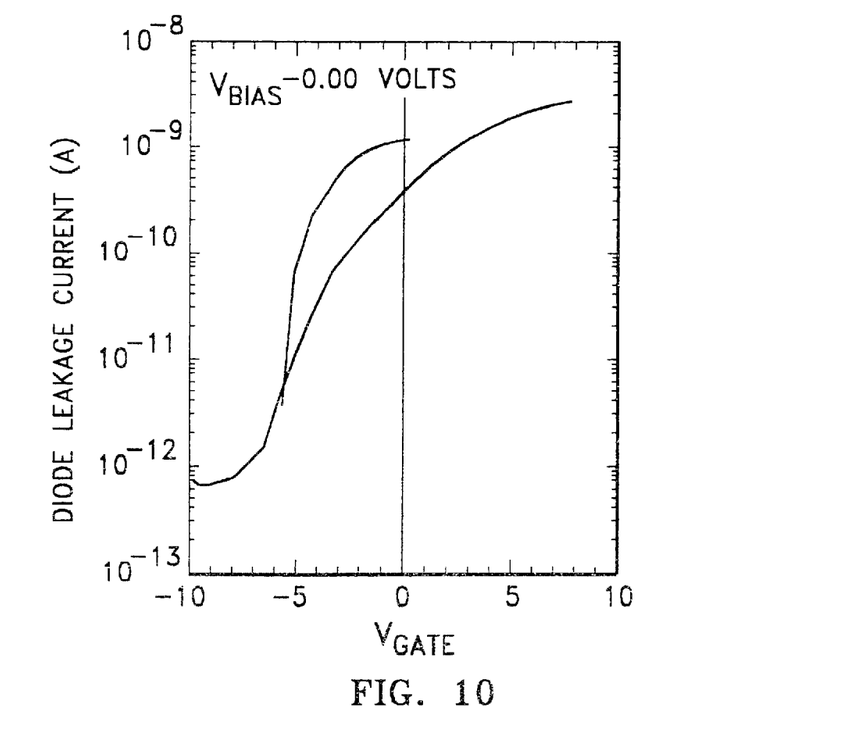
FIG. 10 is a graph presenting experimental data illustrating a decrease in diode leakage employing a device in accordance with the present invention.

FIG. 10 is a graph which shows experimental data, obtained in connection with the development of an experimental gated diode structure of the present invention, evidencing a decrease in reverse bias leakage in a device having a field plate (or belt) 150 extending along the sidewall of the photodiode. In the gated diode device used in generating the data presented in FIG. 10, the gate electrode material employed was indium tin oxide (ITO), and the gate dielectric was silicon nitride, at a thickness of about 0.1 micron. The device was constructed so that a separate bias could be applied to the gate. In the invention the gate electrode is electrically connected to the bias electrode. Without the gate ($V_g$ about 0V) the leakage current in the experimental example would be about $10^{-9}$ A. With the gate tied to $V_{bias}$ about −8V, the leakage would be about $10^{-12}$ A (i.e., $V_{gate}=V_{bias}=-8V$).

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A solid state imager comprising:
   a plurality of photosensor pixels arranged in a pixel array, each of said photosensor pixels comprising:
      a photodiode having a side wall, said sidewall having a gate dielectric layer disposed thereon; and
      a field plate disposed around said photodiode body, said field plate comprising amorphous silicon disposed on said gate dielectric layer, said field plate extending substantially completely around said sidewall of said photodiode.

2. The solid state imager of claim 1 wherein said imager further comprises a common electrode, said field plate being disposed in electrical contact with a portion of said common electrode.

3. A solid state imager as recited in claim 2, wherein said photodiode sidewall is disposed substantially perpendicular with respect to a surface of a substrate on which said pixel array is disposed.

4. A solid state imager as recited in claim 3 wherein said field plate is disposed over the substantially perpendicular portion of said photodiode sidewall.

5. A solid state imager as recited in claim 1 wherein said amorphous silicon material of said field plate extends over said photodiode sidewall and at least a portion of the upper surface of said photodiode body.

6. A solid state imager as recited in claim 5, wherein said photodiode is selected from the group consisting of p-I-n diodes and n-i-p diodes.

7. A method of fabricating an imager array having a plurality of pixels, each pixel comprising a respective pixel thin film transistor and a pixel photosensor, the method comprising, for each respective pixel, the steps of:
   depositing a first conductive layer on a substrate;
   forming a photosensor bottom electrode from said first conductive layer; forming a photosensor body disposed on at least a portion of said photosensor bottom electrode, said photosensor body having sidewalls;
   depositing a gate electrode dielectric layer over said photosensor body;
   forming a layer of field plate comprising amorphous silicon on at least a portion of said gate dielectric layer covering said sidewall of said photosensor body and extending completely around said photosensor body; and
   forming a common electrode in electrical contact with said field plate.

8. The method of claim 7, wherein the step of forming said common electrode further comprises:
   depositing a source/drain conductive material;
   patterning said source/drain conductive material to form said common electrode and to form a source electrode and a drain electrode for a thin film transistor (TFT) for each of said pixels.

9. The method of claim 7, further comprising the step of forming an island of TFT material following deposition of said gate electrode dielectric layer, comprising the steps of:
   depositing a first layer of intrinsic amorphous silicon over substantially an entire exposed surface of said gate dielectric material;
   depositing a second layer of n+-doped amorphous silicon material over said layer of intrinsic amorphous silicon; and
   etching said first and second layers to substantially remove said first and second layers from predetermined portions of said gate dielectric layer disposed so as to leave said first and second layers in selected area where said TFT islands are to be present, and further leaving intact at least a portion of said first layer of amorphous silicon on said sidewall of said photosensor body.

10. The method of claim 9, wherein said etching step comprises a reactive ion etch.

11. The method of claim 10, wherein said reactive ion etch employs an etchant of $SF_6$ or HCl.

12. The method of claim 11, wherein said reactive ion etch includes etching with 20 sccm/30 sccm mixture of $SF_6$ or HCl, at 1.1 W/cm$^2$ and 13.56 MHz, a pressure of about 100 mTorr, wherein the etching is conducted at an emission endpoint of silicon, plus about one to three minutes so as to form said field plate.

13. The method of claim 9, wherein said etching step is carried out using photolithography.

14. The method of claim 7, wherein the step of forming said photosensor body further comprises forming a substantially orthogonal side wall portion, comprising the steps of:
depositing substantially uniform layers of, in succession, an n+-doped amorphous silicon, an intrinsic amorphous silicon, and a p+-doped amorphous silicon, and etching said layers at predetermined locations using a reactive ion etch employing a 20 sccm/30 sccm mixture of $SF_6$/HCl, at $1.6W/cm^2$, and 13.56 MHz, at a pressure between about 80 mTorr and 100 mTorr, to form a photodiode having said substantially vertical sidewall portion extending completely around said photodiode.

15. A radiation imager comprising:
a substrate;
a photosensor array disposed on said substrate, said photosensor array comprising a plurality of pixels, each of said pixels being coupled to a scan line and a data line, each of said pixels further comprising:
a photodiode having a body with sidewalls;
a thin film transistor (TFT), said TFT being electrically coupled to said photodiode and said scan line and data line so as to enable selective readout of the charge of said photodiode;
a common electrode disposed in electrical contact with said photodiodes; and
a field belt comprising amorphous silicon disposed around said photodiode sidewalls with a dielectric material being disposed between said field plate and said photodiode body, said field belt being in electrical contact with said common electrode so as to provide an electric field around said photodiode body in correspondence with the potential of said common electrode.

16. The radiation imager of claim 15 wherein said common electrode, at points where it is disposed over the sidewalls of said photodiode bodies, is disposed over respective TFT islands, said TFT islands comprising silicon materials used in the TFT fabrication process.

17. The radiation imager of claim 16 wherein said photodiode body sidewalls over which said field plate extends comprise a portion that is substantially vertical to the surface of said substrate.

18. The radiation imager of claim 17 wherein said substantially vertical sidewalls are disposed at an angle between about 85 and about 90 degrees with respect to the surface of said substrate.

19. The radiation imager of claim 15 wherein said photodiode is selected from the group consisting of p-i-n diodes and n-i-p diodes.

20. The radiation imager of claim 15 wherein said field plate comprises silicon selected from the group of intrinsic amorphous silicon, n+ doped silicon, and combinations thereof.

* * * * *